US010547930B1

(12) United States Patent
Zhong et al.

(10) Patent No.: US 10,547,930 B1
(45) Date of Patent: Jan. 28, 2020

(54) DYNAMIC RANGE MANAGEMENT OF BONE CONDUCTION SPEAKER OUTPUT

(71) Applicant: AMAZON TECHNOLOGIES, INC., Seattle, WA (US)

(72) Inventors: Xuan Zhong, Mountain View, CA (US); Jianchun Dong, Palo Alto, CA (US); Bozhao Tan, Sunnyvale, CA (US); Han Zhang, Mountain View, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 15/385,511

(22) Filed: Dec. 20, 2016

(51) Int. Cl.
| *H03G 3/20* | (2006.01) |
| *H04R 1/10* | (2006.01) |
| *H04R 3/04* | (2006.01) |
| *G10L 25/84* | (2013.01) |
| *G02B 27/01* | (2006.01) |
| *H03G 3/32* | (2006.01) |
| *G06F 3/041* | (2006.01) |

(52) U.S. Cl.
CPC ....... *H04R 1/1041* (2013.01); *G02B 27/0176* (2013.01); *G10L 25/84* (2013.01); *H03G 3/32* (2013.01); *H04R 3/04* (2013.01); *G02B 2027/0178* (2013.01); *G06F 3/041* (2013.01); *H04R 2430/01* (2013.01); *H04R 2460/13* (2013.01)

(58) Field of Classification Search
CPC ... H04R 1/1041; G02B 27/0176; G10L 25/84; H03G 3/32
See application file for complete search history.

(56) References Cited

U.S. PATENT DOCUMENTS

| 9,482,882 | B1 | 11/2016 | Hanover et al. | |
| 10,356,231 | B2 * | 7/2019 | Hosoi | |
| 2008/0175399 | A1 * | 7/2008 | Kim | H03G 3/32 381/57 |
| 2011/0293105 | A1 * | 12/2011 | Arie | H04M 1/05 381/71.11 |
| 2015/0271590 | A1 * | 9/2015 | Nakagawa | H04R 1/1091 381/151 |
| 2017/0011600 | A1 * | 1/2017 | Joung | H04M 1/72558 |
| 2017/0064485 | A1 * | 3/2017 | Song | H04S 5/02 |
| 2017/0208382 | A1 * | 7/2017 | Grinker | G10K 11/1784 |

* cited by examiner

*Primary Examiner* — Simon King
(74) *Attorney, Agent, or Firm* — Lindauer Law, PLLC

(57) ABSTRACT

A head-mounted wearable device (HMWD) may incorporate bone conduction speakers (BCS) to generate audio output that is perceptible to a wearer. Due to the mechanical connection between the BCS and the rest of the device, when the output amplitude of the BCSs is too great, the air-conducted audio "leaks" and may be heard by other people. This leakage may result in eavesdropping by, or generate a nuisance to, those other people. The noise level in the environment around the HMWD is determined and used to dynamically adjust the amplitude of the audio output generated by the BCS. This adjustment improves the comfort and intelligibility of the audio output to the wearer while minimizing audio leakage to the surrounding environment.

24 Claims, 8 Drawing Sheets

DYNAMIC RANGE MANAGEMENT OF BONE CONDUCTION SPEAKER OUTPUT

BACKGROUND

Wearable devices provide many benefits to users, allowing easier and more convenient access to information and services.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features.

Figure 1:
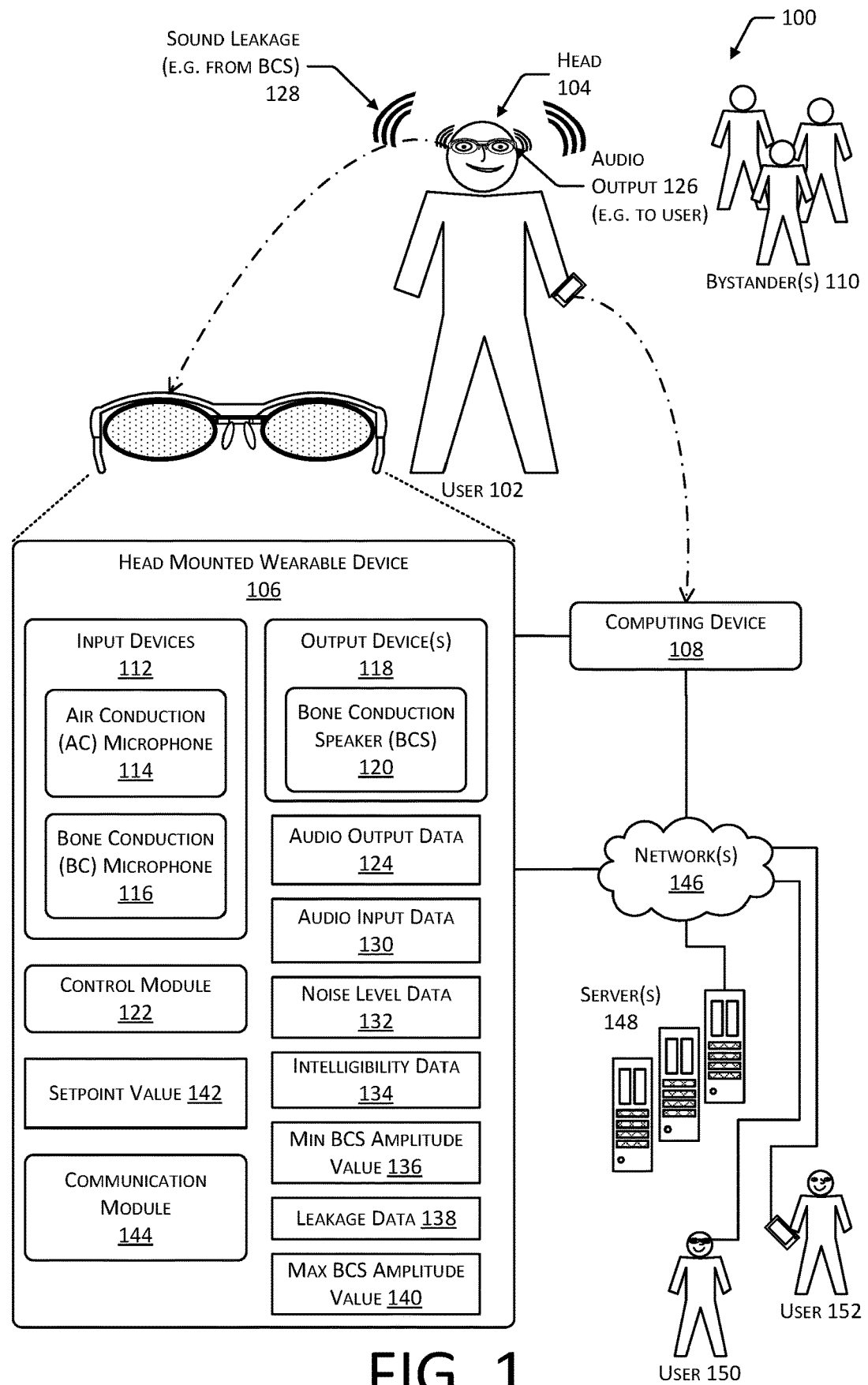
FIG. 1 depicts a system including a head-mounted wearable device (HMWD) that utilizes dynamic range management of bone conduction speaker (BCS) output, according to some implementations.

While implementations are described herein by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean "including, but not limited to".

DETAILED DESCRIPTION

Wearable devices provide many benefits to users, allowing easier and more convenient access to information and services. For example, a head-mounted wearable device (HMWD) having a form factor similar to eyeglasses may provide a ubiquitous and easily worn device that facilitates access to information. In other examples, the wearable devices may be worn as necklaces, scarves, and so forth.

The HMWD may operate independently as a standalone device, or may operate in conjunction with another computing device. For example, the HMWD may operate in conjunction with a smart phone, tablet, network service operating on servers, and so forth. The HMWD includes input devices and output devices that provide a user interface to the user. In one implementation, the HMWD may use the computing device to provide access to a wide area network, compute resources, data storage, a display for image output, and so forth.

Among the input devices, the HMWD may include an air conduction (AC) microphone that detects sounds transferred by air, a bone conduction (BC) microphone that detects sounds transferred by another medium such as the head of the user, and so forth. Among the output devices, the HMWD may include a bone conduction speaker (BCS). The BCS comprises an actuator that provides a physical displacement responsive to a drive signal. For example, the BCS may comprise a piezoelectric material that, upon application of a voltage, physically changes shape. In another example, the BCS may comprise an electromagnet that, upon application of a voltage, moves a core. During operation, part of the BCS is in contact with a part of the user's head. As the BCS vibrates responsive to the drive signal, the vibration is mechanically coupled to the user's skull. As a result, the user is able to hear sounds.

Use of the BCS conveys several advantages. The ears of the user remain unobstructed by conventional earphones, providing the user with improved acoustic awareness of their surroundings. By transferring the sound vibrations into the skull of the user, the content of the audio output may be more easily safeguarded to minimize eavesdropping. However, during operation, some of the vibrations produced by the BCS may produce audible sound leakage. For example, at higher amplitude levels of output, the vibrations produced by the BCS may produce sound leakage into the surrounding air as well as audio output in the head of the user.

Sound leakage from the BCS may result in information being audible that the user might otherwise wish to keep private from nearby bystanders. As a result, controlling sound leakage when using a BCS is important for the security of information accessed by the HMWD. Sound leakage may also be deemed a nuisance by bystanders. For example, bystanders may not wish to listen to the audio output.

The sound environment near the HMWD may also change dynamically. For example, the user wearing the HMWD may walk from a quiet room into a noisy room. In another example, the location where the user is may transition quickly from being noisy to being quiet.

As the level of noise around the HMWD changes, the ability for the user to understand the audio output is impacted. For example, in a noisy environment, the amplitude of the audio output of the BCS may be too low for the user to understand the spoken word in the audio output. In this case, the signal-to-noise ratio (SNR) of the audio output relative to the background noise as provided to the user is too low for intelligibility. In another example, in a quiet environment, the amplitude of the audio output by the BCS may be too high, resulting in sound leakage to the adjacent environment, a perceived loudness by the user that is not preferred, and so forth. In this case, the SNR of the audio output relative to the background noise as experienced by the bystanders is too great.

Described are techniques to dynamically control the amplitude of the BCS of a HMWD based on a noise level. In one implementation, an air conduction microphone (AC mic) of the HMWD may be used to acquire samples of sounds. For example, a sample may comprise a digitized representation of audio at a particular interval of time. These samples may be used to determine noise level data. The noise level data may be used to select constraint parameters such as a minimum BCS amplitude and a maximum BCS amplitude. These constraint parameters are then used to control operation of control circuitry that drives the BCS. In one implementation, intelligibility data associates a particular noise level value with a particular minimum BCS amplitude value. The minimum BCS amplitude value is configured to provide a minimum SNR for the user such that the audio output from the BCS is intelligible under the noise conditions present at the HMWD. Leakage data associates a particular noise level value with a particular maximum BCS amplitude value. The maximum BCS amplitude value is configured to minimize the SNR for the sound leakage, such that the audio output is unintelligible under the noise conditions present.

By using the intelligibility data and the leakage data, and given the noise level data, a minimum BCS amplitude value and a maximum BCS amplitude value are determined. For example, the intelligibility data may indicate that with a noise level of 35 Decibel A-weighting (dBA) the minimum BCS amplitude value is 20 dBA, while the leakage data may indicate that with the noise level of 35 dBA the maximum BCS amplitude value is 62 dBA. The minimum BCS amplitude value and the maximum BCS amplitude value thus define constraints within which the control circuitry may operate when providing a drive signal to the BCS. The constraints may further include one or more of minimum or maximum values that the BCS is physically capable of, or that is permitted to generate.

The system may operate dynamically, determining noise level data and the constraints subsequently changing responsive to this. The change from one set of constraints to another may be configured to ramp or occur over a predetermined period of time. For example, a change in the constraint values and subsequent adjustment to the drive signal that drives the BCS may occur over a few seconds to avoid abrupt changes in the amplitude of the audio output.

The user may manually select a setpoint value that specifies a desired amplitude of the audio output, or volume. For example, using a touch sensor, button, verbal command, and so forth, the user may increase or decrease the setpoint value for the amplitude of the audio output from the BCS. The output of this setpoint value may be limited by the constraints. For example, while the audio output may be muted and thus set to zero, during operation where audio output is to be provided, the BCS is constrained by the minimum BCS amplitude value and the maximum BCS amplitude value.

As the constraints change over time responsive to changing noise levels, the setpoint value may be adjusted. For example, as the user wearing the HMWD walks into a noisy room, the amplitude of the audio output increases to maintain intelligibility, but does not increase so loudly that bystanders can understand what is being said.

In one implementation, the adjustment to the setpoint value may maintain a particular level of SNR as conditions change. In another implementation, the adjustment to the setpoint value may maintain a particular level of perceived loudness as conditions change. For example, at a first time, the setpoint value is 42 dBA or 25% of the range available given first constraints that are responsive to a first noise level. Continuing the example, at a second time, the noise level has increased, and so the values of the constraints have been increased as well. At this second time, the setpoint value may now be 67 dBA but remains at 25% of the range available given the second constraints.

By using the techniques described, sound leakage from the BCS is mitigated while also improving the experience of the user and the bystanders. Unwanted disclosure of confidential information that is presented audibly using the audio output of the BCS may be prevented without requiring the user to adjust the volume of the HMWD or forego presentation of that audio output.

The dynamic adjustment also minimizes the occurrence of sound leakage that is unexpectedly loud that results from the user forgetting to turn down the volume of their HMWD. For example, as the user wearing the HMWD moves from a noisy to a quiet room, the absolute value of the setpoint value decreases. This decrease in the setpoint value prevents a blast of sound from the BCS that is perceived as being too loud by the user and possibly the bystanders.

Illustrative System

FIG. 1 depicts a system 100 in which a user 102 is wearing on their head 104 a head-mounted wearable device (HMWD) 106 in a general form factor of eyeglasses. The HMWD 106 may incorporate hinges to allow the temples of the eyeglasses to fold.

The HMWD 106 may be in communication with one or more affiliated computing devices 108. For example, the HMWD 106 may communicate with the computing device 108 using a personal area network (PAN) such as Bluetooth. The computing device 108 may be used at least in part to provide additional resources, such as access to the network, compute resources, storage, display output, and so forth. The computing devices 108 may comprise a smart phone, tablet, local server, in vehicle computer system, and so forth. For example, the computing device 108 may comprise a smart phone that includes a display. The display of the smart phone may be used to present a graphical user interface. In some situations, there may be bystanders 110 near the HMWD 106. For example, the user 102 wearing the HMWD 106 may be standing in a crowd, sitting on a bus, sitting in an auditorium, and so forth.

The HMWD 106 may include input devices 112. The input devices 112 may comprise an air conduction (AC) microphone 114, bone conduction (BC) microphone 116, buttons, touch sensors, and so forth. The input devices 112 are discussed in more detail with regard to FIG. 3.

The HMWD 106 may include one or more output devices 118. The output devices 118 may include a bone conduction speaker (BCS) 120, display lights, and so forth. The BCS 120, or a portion thereof, is in contact with a portion of the user 102. For example, a movable element of the BCS 120 may be in mechanical contact with the head 104 of the user 102. As the movable element is physically displaced, it produces vibrations within the head 104 of the user 102. These vibrations are then perceived as sound by the ear of the user 102. The output devices 118 are discussed in more detail with regard to FIG. 3.

A control module 122 may be used to control operation of the BCS 120. Audio output data 124 comprises information representative of an audio signal. For example, the audio output data 124 may comprise a pulse code modulated (PCM) stream of audio. The control module 122 may direct to the BCS 120 to present the audio output data 124. For example, control circuitry may accept as input the audio output data 124 and generate an analog drive signal that causes the BCS 120 to produce vibrations that produce audio output 126.

In some situations, operation of the BCS 120 to provide audio output 126 may also result in sound leakage 128. For example, the head 104 of the user 102 may radiate sound. In another example, the motion of the movable element of the BCS 120 may cause vibrations in the air, resulting in sound leakage 128. If the amplitude of the sound leakage 128 is sufficient, the bystanders 110, other microphones separate from the HMWD 106, or other observers may be able to hear the audio output 126 and understand it. If the sound leakage 128 is intelligible, information may be inadvertently provided to the bystanders 110. For example, the user 102 may be using the HMWD 106 to place a private telephone call. The user 102, the party to whom they are speaking, or both may not wish to have the content of that telephone call shared with others such as the bystanders 110. The sound leakage 128 may also present a nuisance to the bystanders 110. For example, the bystanders 110 may not wish to hear the audio output 126.

The HMWD 106 may be configured to dynamically constrain the amplitude that the BC speaker (BCS) 120 is permitted to produce. The control module 122 may access audio input data 130. For example, the audio input data 130 may be obtained using the AC microphone 114. The control module 122 may process the audio input data 130 to generate noise level data 132. For example, the noise level data 132 may be indicative of an average energy of at least some of the samples in the audio input data 130.

In some implementations, the noise level data 132 may be based on samples, or portions thereof, that are associated with a particular frequency or range of frequencies. For example, the noise level data 132 may indicate the average energy of the samples for all frequencies sampled. In another example, the noise level data 132 may indicate the average energy of those samples having frequencies between 500 Hz and 5 kHz. The noise level data 132 may be obtained using data in a narrow bandwidth or a wide bandwidth.

The control module 122 may access intelligibility data 134. The intelligibility data 134 comprises information that associates a particular noise level value with a particular minimum BCS control value, such as a minimum BCS amplitude value 136. For example, the intelligibility data 134 may be stored in a data structure such as a lookup table. In some implementations, leakage data 138 may be generated experimentally, empirically, and so forth. A minimum BCS control value, such as a minimum BCS amplitude value 136 may be retrieved for the noise level data 132 that was generated. The minimum BCS amplitude value 136 may be configured to provide a minimum signal-to-noise ratio (SNR) for the user 102 such that the audio output 126 from the BCS 120 is intelligible under the noise conditions present at the HMWD 106.

The control module 122 may access leakage data 138. The leakage data 138 comprises information that associates a particular noise level value with a particular maximum BCS amplitude value 140. In some implementations, leakage data 138 may be generated experimentally, empirically, and so forth. A maximum BCS amplitude value 140 may be retrieved for the noise level data 132 that was generated. The maximum BCS amplitude value 140 may be configured to minimize the SNR for the sound leakage 128, such that the audio output 126 is unintelligible under the noise conditions present. For example, the maximum BCS amplitude value 140 may be designed such that the sound leakage 128 may occur, but it is so quiet that the bystanders 110 are not able to clearly understand the audio output 126. For example, the maximum BCS amplitude value 140 may produce sound leakage 128 that exhibits a SNR of 0 dBA or less. In some implementations, the leakage data 138 may be based on the sound leakage 128 producing a particular sound pressure level (SPL) at a specified distance and given particular conditions, such as standard temperature and pressure.

During operation, the control module 122 may generate BCS control parameters that instruct control circuitry of the BCS 120. For example, the BCS control parameters may specify an amplification level to be used by a final amplifier of the control circuitry that generates the drive signal that is sent to the BCS 120. In other implementations, the BCS control parameters may specify one or more of output level, output voltage, output power, attenuation level, pulse width, pulse modulation, and so forth. The control module 122 is thus able to constrain the operation of the BCS 120.

A setpoint value 142 specifies the amplitude of the audio output 126 as constrained between the minimum BCS amplitude value 136 and the maximum BCS amplitude value 140. In some implementations, the setpoint value 142 may be indicative of, or used to set, a gain or amplification of control circuitry that drives the BCS 120. For example, the setpoint value 142 may specify an average gain of the final amplifier of the control circuitry.

The setpoint value 142 may be set responsive to user input data. For example, the user 102 may utilize an input device 112 such as a touch sensor to increase or decrease the setpoint value 142 until the audio output 126 is at a desired level. In some implementations, the setpoint value 142 may be expressed in terms of decibels (dB), as a percentage of a range between the minimum BCS amplitude value 136 and the maximum BCS amplitude value 140, an arbitrary value, and so forth. As the constraints change, the setpoint value 142 may be adjusted. For example, as the noise level data 132 indicates an increase in the level of noise, the control module 122 may increase the absolute value of the minimum BCS amplitude value 136 and the maximum BCS amplitude value 140. The setpoint value 142 may also be adjusted upward. For example, the setpoint value 142 may be increased such that the perceived loudness of the audio output 126 remains approximately constant.

Operation of the control module 122 with regard to the constraints placed on the operation of the BCS 120 are discussed in more detail in the following figures.

The HMWD 106 may also include a communication module 144. The communication module 144 may be configured to establish communication with other devices. The communication module 144 may use one or more communication interfaces to establish communication with the other devices via one or more networks 146. For example, the network 146 may comprise a personal area network, local area network, metropolitan area network, wide area network, and so forth. The HMWD 106 may use the networks 146 to access one or more services that are provided by the other devices. For example, the HMWD 106 may establish communication with one or more servers 148. These one or more servers 148 may provide one or more services, such as automated speech recognition, information retrieval, messaging, and so forth.

The communication module 144 may also be used to establish communications with one or more other users 102. For example, the user 102 of the HMWD 106(1) may initiate a real-time call (RTC) with the user 150 who is also wearing a HMWD 106(2). Audio associated with the RTC may be transferred using the network 146. Management of the call may be facilitated by one or more services executing on the one or more servers 148. The HMWD 106 may also be used to facilitate communication with other devices. For example, the HMWD 106(1) used by the user 102 may be used to establish communication with a user 152 that is using an application executing on a computing device 108(2).

While the HMWD 106 is described in the form factor of eyeglasses, the HMWD 106 may be implemented in other form factors. For example, the HMWD 106 may comprise a device that is worn behind an ear of the user 102, on a headband, as part of a necklace, and so forth. In some implementations, the HMWD 106 may be deployed as a system, comprising several devices that are in communication with one another.

The structures depicted in this and the following figures are not necessarily according to scale. Furthermore, the proportionality of one component to another may change with different implementations. In some illustrations, the size of one structure may be exaggerated with respect to another to facilitate illustration, and not necessarily as a limitation.

Figure 2:
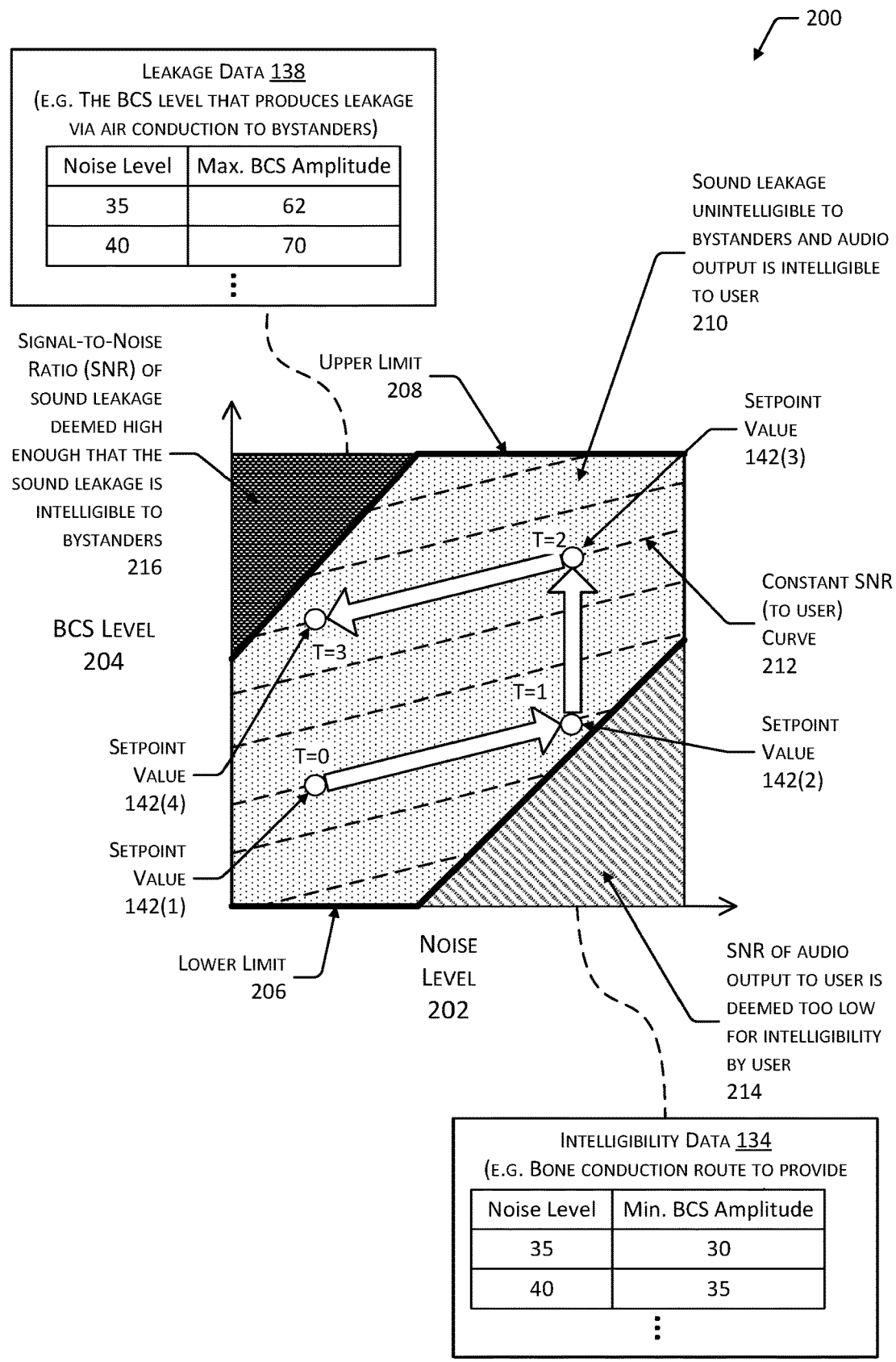
FIG. 2 depicts a graph of noise level and corresponding constraints on the amplitude of audio output from the BCS, according to some implementations.

FIG. 2 depicts a graph 200 of noise level and corresponding constraints on the amplitude of audio output 126 from the BCS 120, according to some implementations. In this graph, noise level 202 is depicted along the horizontal axis while a BCS level 204 is depicted along a vertical axis. The noise level 202 is indicative of a level of noise associated with the environment in which the HMWD 106 is located. The BCS level 204 may be indicative of level of output of the BCS 120 during operation. In one implementation, the units used on both axes may be A-weighted decibels (dBA). In other examples, other units may be used.

A lower limit 206 is indicated along the bottom of the graph 200 by a solid dark line. The lower limit 206 may be expressed in a data structure such as the intelligibility data 134. In this illustration, the intelligibility data 134 comprises a table that associates noise level 202 with a minimum BCS amplitude value 136. The intelligibility data 134 may be determined empirically or experimentally.

An upper limit 208 is indicated along the top of the graph 200 by solid dark line. The upper limit 208 may also be expressed in the data structure such as the leakage data 138. In this illustration, leakage data 138 comprises a table that associates noise level 202 with a maximum BCS amplitude value 140. The leakage data 138 may be determined empirically or experimentally.

In between the lower limit 206 and the upper limit 208 is an area in which the sound leakage 128 to bystanders 110 is deemed to be unintelligible and yet the audio output 126 is intelligible to the user 102. It is within this area 210 that the control module 122 constrains operation of the BCS 120. Shown within this area 210 are constant SNR curves 212. The constant SNR curves 212 are representative of a SNR of the audio output 126 as received by the user 102.

Depicted in this graph 200, below the lower limit 206, is an area 214 in which the SNR of the audio output 126 is deemed to be too low to be intelligible by the user 102. If the BCS 120 were operated within this area 214, the audio output 126 may be unintelligible or be below a perceptible threshold and thus be unheard. As depicted here, as the noise level 202 increases, the lower limit 206 also increases. This is because an increase in the BCS level 204 is needed to maintain a desired SNR as the noise level 202 increases. For example, if the user 102 is wearing the HMWD 106 and is a noisy room, the volume of the audio output 126 may be increased so that the user 102 can still understand the audio output 126.

A special case occurs when no audio output 126 is desired. For example, if the audio output 126 is muted, the BCS level 204 will be sent to zero, below the lower limit 206.

Also depicted in this graph 200, above the upper limit 208 is an area 216 in which the SNR of sound leakage 128 is deemed high enough that the leaked sound is intelligible to bystanders 110. For example, a threshold of the SNR of the sound leakage 128 that specifies the upper limit 208 may be a value of 1 dBA or less. If the BCS 120 is operated within this area 216, the audio output 126 may be intelligible to the user 102, but the sound leakage 128 is also intelligible to bystanders 110.

By operating the BCS 120 such that output is constrained within the area 210, the audio output 126 is intelligible to the user 102 while the sound leakage 128 is minimized to discourage eavesdropping by bystanders 110. As the noise level around the HMWD 106 changes, dynamic adjustment maintains the BCS level 204 within the area 210. The following example illustrates how the setpoint value 142 may be changed both automatically by the control module 122 and manually, such as by the user 102.

Depicted is a first setpoint value 142(1). This first setpoint value 142(1) may be set at time T=0. For example, the user 102 may use a spoken command that is processed by an automated speech recognition system to adjust the volume of the HMWD 106 to this level.

Between times T=0 and T=1, the noise surrounding the HMWD 106 has increased. The noise level data 132 is determined, and the increase is detected. As a result, the control module 122 determines the new constraints, such as an increased minimum BCS amplitude value 136 and an increased maximum BCS amplitude value 140. As a result of the change in the constraints, the first setpoint value 142(1) has been increased to a second setpoint value 142(2). This change from setpoint value 142(1) to setpoint value 142(2) occurs along a line of constant SNR curve 212. For example, to the user 102, the perceived loudness of the audio output 126 remains approximately the same even though the absolute value of the sound pressure level of the audio output 126 has increased.

Between times T=1 and T=2, the user 102 has decided to manually increase the volume of the audio output 126. For example, the user 102 may use a touch sensor to make a swipe gesture that is associated with a command to increase the volume. As a result, from T=1 to T=2, the setpoint value 142(2) has been correspondingly increased to the setpoint value 142(3) and is now at a BCS level 204 which is greater than the second setpoint value 142(2).

Between times T=2 and T=3, the noise surrounding the HMWD 106 has decreased to about the same level as at T=0. As a result, the control module 122 determines the new constraints, such as a decreased minimum BCS amplitude value 136 and a decreased maximum BCS amplitude value 140. As a result of the change in the constraints, the setpoint value 142(4) has also been decreased.

By using the control module 122, the output of the BCS 120 may be dynamically adjusted within the area 210, as subject to changes such as those responsive to input provided by the user 102. As a result, the user 102 retains the ability to control the audio output 126 while reducing or eliminating the need for ongoing adjustments as the noise level 202 at the HMWD 106 changes with time.

The various limits and curves in this graph are depicted as being linear for ease of illustration, and not necessarily as a limitation. For example, one or more of the lower limit 206, the upper limit 208, and the constant SNR curves 212 may be non-linear, irregular, and so forth.

Figure 3:
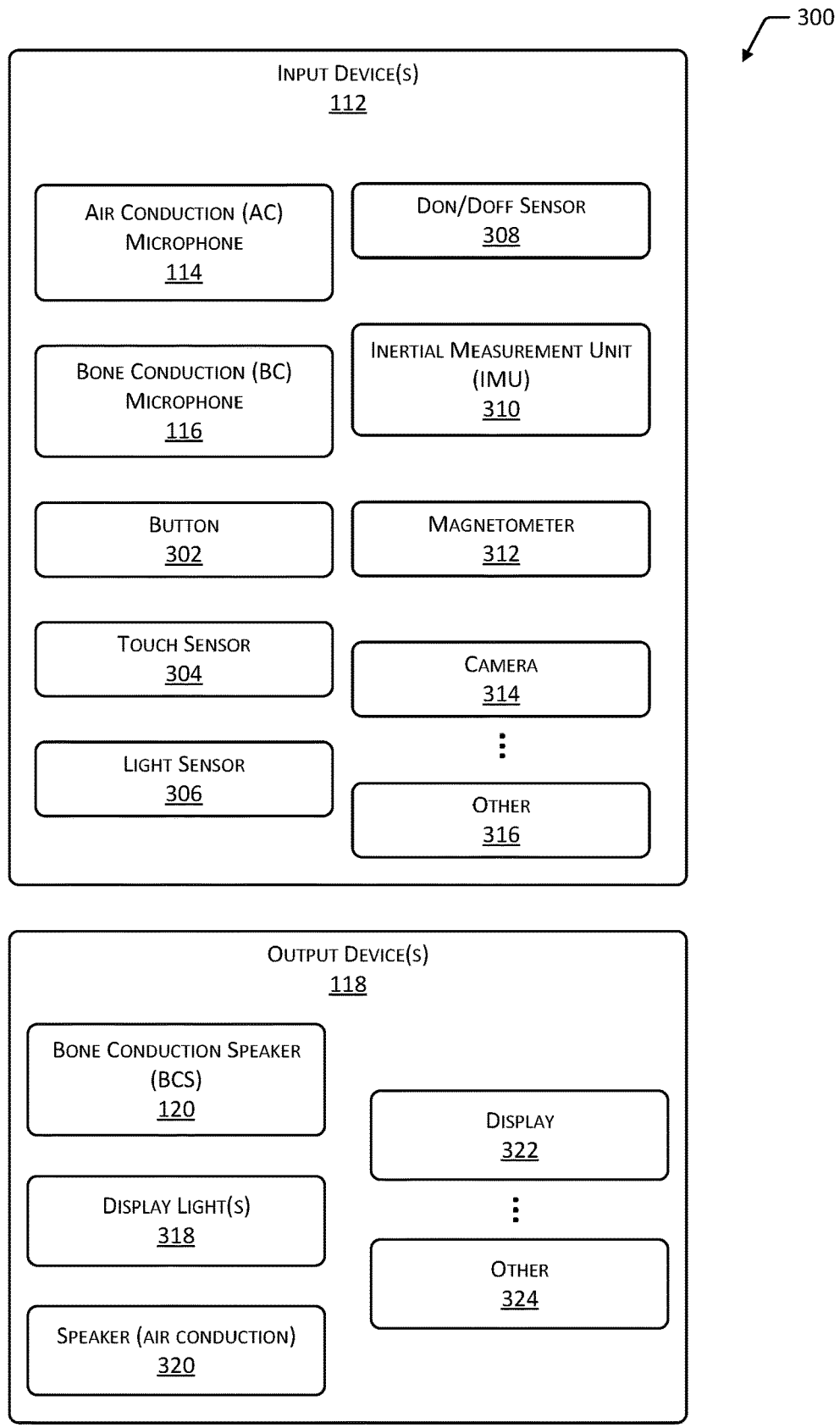
FIG. 3 provides an illustration of several input devices and output devices that may be used by the head-mounted wearable device, according to some implementations.

FIG. 3 provides an illustration 300 of several input devices 112 and output devices 118 that may be used by the HMWD 106, according to some implementations.

As described above, the input devices 112 of the HMWD 106 may include one or more AC microphones 114. The AC microphone 114 may comprise a diaphragm or other elements that move in response to the displacement of air by sound waves. In one implementation, a first AC microphone 114 may be located in or proximate to a frame bridge 512, while a second AC microphone 114 may be located in or proximate to a hinge.

The BC microphone 116 is responsive to the vibrations produced by the user 102, such as while speaking. The BC microphone 116 may be arranged to be in contact with the skin above a bony or cartilaginous structure. In one implementation, where the HMWD 106 is in the form of eyeglasses, one or more BC microphones 116 may be located in one or both temples. In another implementation, where the HMWD 106 is in the form of eyeglasses, nose pads of a nosepiece may be mechanically coupled to the BC microphone 116 such that vibrations of the nasal bone, glabella, or other structures upon which the nose pads may rest are transmitted to the BC microphone 116 in or near a bridge of the eyeglasses. In other implementations, the BC microphone 116 may be located elsewhere with respect to the HMWD 106 such in the temples of the HMWD 106, or worn elsewhere by the user 102. For example, the BC microphone 116 may be incorporated into a hat or headband.

The input devices 112 may include one or more the following devices. A button 302 may comprise a switch or other mechanism that is responsive to an external force. For example, the button 302 may comprise a spring-biased switch that, when depressed, establishes an electric connection.

A touch sensor 304 is responsive to a touch by the user 102 or another object. For example, the touch sensor 304 may comprise a capacitive touch sensor, a force sensitive resistor touch sensor, an optical touch sensor, and so forth.

A light sensor 306 may comprise one or more of a photodetector, semiconductor junction, or other device that is sensitive to the presence or absence of light. The light sensor 306 may comprise an ambient light sensor that provides information indicative of the level of illumination present at the HMWD 106.

A don/doff sensor 308 provides information indicative of whether the HMWD 106 is currently being worn by the user 102. For example, the don/doff sensor 308 may comprise a proximity sensor that determines likely presence or absence of the head 104. The don/doff sensor 308 may use optical, electrical, ultrasonic, electromagnetic, signal processing of data from other sensors, or other techniques to determine a presence of the head 104. In some implementations, the don/doff sensor 308 may use an optical emitter and an optical detector to determine proximity. For example, an optical emitter may emit light, a portion of which may then be reflected by the object back to the optical detector to provide an indication that the head 104 is proximate to the don/doff sensor 308. In another implementation, the don/doff sensor 308 may comprise a capacitive sensor configured to provide an electrical field and determine a change in electrical capacitance due to presence or absence of the head 104 within the electrical field. In yet another implementation, instead or in addition to the don/doff sensor 308, a sound may be periodically emitted by the BCS 120 and detected by the BC mic 116. For example, if the amplitude or other characteristic of the sound emitted by the BCS 120 as detected by the BC mic 116 exceeds a threshold value, the HMWD 106 may be deemed to be donned. This may occur as the user's head 104 transmits the audio output 126 with less attenuation than ambient air.

An inertial measurement unit (IMU) 310 provides information about the movement of the HMWD 106 in space. For example, the IMU 310 may comprise one or more accelerometers, gyroscopes, and so forth. In one implementation, the IMU 310 may comprise three accelerometers, with each accelerometer oriented orthogonal to the others. The IMU 310 may include one or more gyroscopes that sense rotation about one or more mutually orthogonal axes.

A magnetometer 312 provides information about ambient magnetic fields, such as the terrestrial magnetic field. Output from the magnetometer 312 may be used to determine a change heading with respect to the Earth's magnetic field. In some implementations, the IMU 310 may include the magnetometer 312.

A camera 314 may be used to acquire image data. The camera 314 may be configured to detect light in one or more wavelengths including, but not limited to, terahertz, infrared, visible, ultraviolet, and so forth. The camera 314 may comprise one or more charge coupled devices (CCD), complementary metal oxide semiconductor (CMOS) devices, microbolometers, and so forth.

Other sensors 316 may also be present. For example, a barometric sensor may provide information about ambient air pressure with respect to a reference pressure.

As described above, the output devices 118 of the HMWD 106 may include a BCS 120. The BCS 120 may be used to provide audio output 126 to the user 102. In one implementation, the BCS 120 may comprise a piezoelectric transducer. The BCS 120 may be in contact with at least a portion of the head 104 of the user 102. When activated, the BCS 120 generates vibrations in at least a portion of the head 104 of the user 102. These vibrations may be perceived as sound by the ear(s) of the user 102. The BCS 120 may use one or more mechanisms to generate the output. These mechanisms may include, but are not limited to, the following: voice coils, piezoelectric elements, magnetostrictive elements, electrostatic elements, and so forth. Compared to an air-conduction loudspeaker, the BCS 120 may omit a diaphragm. Instead of using intermediate air to transfer soundwaves as the air-conduction loudspeaker does, the BCS 120 imparts a vibration onto a portion of the user's 102 anatomy, such as to the skull.

The output devices 118 may include one or more display lights 318. The display lights 318 may comprise one or more light-emitting diodes, quantum dots, incandescent lamps, electroluminescent materials, and so forth. When activated, a display light 318 emits light. One or more display lights 318 may be positioned within the field of view of the user 102 while the HMWD 106 is worn on the head 104. For example, one or more display lights 318 may be arranged just above one or both lenses of the HMWD 106.

An air conduction speaker 320 that operates by air conduction to the ear of the user 102 may also be used to provide audio output 126 to the user 102. For example, the speaker 320 may comprise a diaphragm that is moved to generate sound waves in the air. The speaker 320 may use one or more mechanisms to generate the output. These mechanisms may include, but are not limited to, the following: voice coils, piezoelectric elements, magnetostrictive elements, electrostatic elements, and so forth. In some implementations, the techniques described herein may be applied to the output from the air conduction speaker 320. For example, operation of the air conduction speaker may be constrained based on the noise level.

A display 322 may be provided in some implementations. The display 322 is configured to present an image to the user 102 or to a light-sensitive sensor such as a camera or an optical sensor. For example, the display 322 may comprise a liquid crystal display that manipulates rows and columns of picture elements to form an image.

In some implementations, the display 322 may be configured to produce output in one or more of infrared, visible, or ultraviolet light. The output may be monochrome or color.

The display 322 may be emissive, reflective, or both. An emissive display 322, such as using light emitting diodes (LEDs), is configured to emit light during operation. In comparison, a reflective display 322, such as using an electrophoretic element, relies on ambient light to present an image. Backlights or front lights may be used to illuminate a non-emissive display 322 to provide visibility of the output in conditions where the ambient light levels are low.

The display 322 may include, but is not limited to, micro-electromechanical systems (MEMS), spatial light modulators, electroluminescent displays, quantum dot displays, liquid crystal on silicon (LCOS) displays, cholesteric displays, interferometric displays, liquid crystal displays (LCDs), electrophoretic displays, and so forth. For example, the display 322 may use a light source and an array of MEMS-controlled mirrors to selectively direct light from the light source to produce an image. These display mechanisms may be configured to emit light, modulate incident light emitted from another source, or both. The display 322 may operate as panels, projectors, and so forth.

The display 322 may include image projectors. For example, the image projector may be configured to project an image onto a surface or object, such as a lens or the eye of the user 102. The image may be generated using MEMS, LCOS, lasers, and so forth.

Other output devices 324 may also be used by the HMWD 106. For example, the HMWD 106 may include a dispenser to release particular scents near the nose of the user 102.

Figure 4:
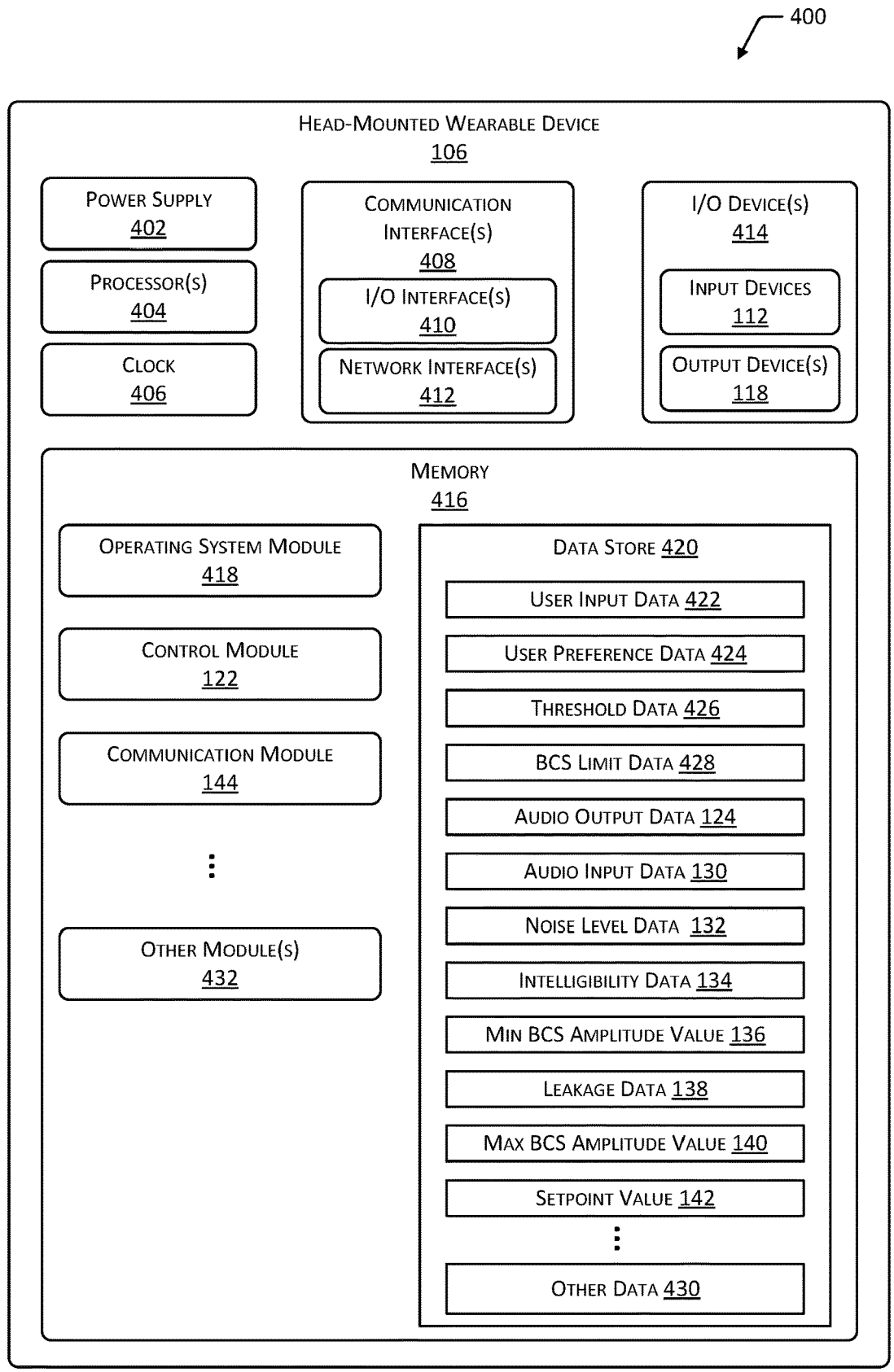
FIG. 4 is a block diagram of components of the head-mounted wearable device, according to some implementations.

FIG. 4 is a block diagram of components of the HMWD 106, according to some implementations.

One or more power supplies 402 may be configured to provide electrical power suitable for operating the components in the HMWD 106. The one or more power supplies 402 may comprise batteries, capacitors, fuel cells, photovoltaic cells, wireless power receivers, conductive couplings suitable for attachment to an external power source such as provided by an electric utility, and so forth. For example, the batteries on board the HMWD 106 may be charged wirelessly, such as through inductive power transfer. In another implementation, electrical contacts may be used to recharge the HMWD 106.

The HMWD 106 may include one or more hardware processors 404 (processors) configured to execute one or more stored instructions. The processors 404 may comprise one or more cores. The processors 404 may include general purpose microprocessors, microcontrollers, application specific integrated circuits (ASICs), digital signal processors (DSPs), and so forth. One or more clocks 406 may provide information indicative of date, time, ticks, and so forth. For example, the processor 404 may use data from the clock 406 to associate a particular interaction with a particular point in time.

The HMWD 106 may include one or more communication interfaces 408 such as input/output (I/O) interfaces 410, network interfaces 412, and so forth. The communication interfaces 408 enable the HMWD 106, or components thereof, to communicate with other devices or components. The communication interfaces 408 may include one or more I/O interfaces 410. The I/O interfaces 410 may comprise Inter-Integrated Circuit (I2C), Serial Peripheral Interface bus (SPI), Universal Serial Bus (USB) as promulgated by the USB Implementers Forum, RS-232, and so forth.

The I/O interface(s) 410 may couple to one or more I/O devices 414. The I/O devices 414 may include the input devices 112. The I/O devices 414 may also include the output devices 118. In some embodiments, the I/O devices 414 may be physically incorporated with the HMWD 106 or may be externally placed. The output devices 118 are configured to generate signals, which may be perceived by the user 102 or may be detected by sensors.

The network interfaces 412 may be configured to provide communications between the HMWD 106 and other devices, such as the server 148. The network interfaces 412 may include devices configured to couple to personal area networks (PANs), wired or wireless local area networks (LANs), wide area networks (WANs), and so forth. For example, the network interfaces 412 may include devices compatible with Ethernet, Wi-Fi, Bluetooth, Bluetooth Low Energy, ZigBee, and so forth.

The HMWD 106 may also include one or more busses or other internal communications hardware or software that allow for the transfer of data between the various modules and components of the HMWD 106.

As shown in FIG. 4, the HMWD 106 includes one or more memories 416. The memory 416 may comprise one or more non-transitory computer-readable storage media (CRSM). The CRSM may be any one or more of an electronic storage medium, a magnetic storage medium, an optical storage medium, a quantum storage medium, a mechanical computer storage medium, and so forth. The memory 416 provides storage of computer-readable instructions, data structures, program modules, and other data for the operation of the HMWD 106. A few example functional modules are shown stored in the memory 416, although the same functionality may alternatively be implemented in hardware, firmware, or as a system on a chip (SoC).

The memory 416 may include at least one operating system (OS) module 418. The OS module 418 is configured to manage hardware resource devices such as the I/O interfaces 410, the I/O devices 414, the communication interfaces 408, and provide various services to applications or modules executing on the processors 404. The OS module 418 may implement a variant of the FreeBSD operating system as promulgated by the FreeBSD Project; other UNIX or UNIX-like variants; a variation of the Linux operating system as promulgated by Linus Torvalds; the Windows operating system from Microsoft Corporation of Redmond, Wash., USA; and so forth.

Also stored in the memory 416 may be a data store 420 and one or more of the following modules. These modules may be executed as foreground applications, background tasks, daemons, and so forth. The data store 420 may use a flat file, database, linked list, tree, executable code, script, or other data structure to store information. In some implementations, the data store 420 or a portion of the data store 420 may be distributed across one or more other devices including servers 148, network attached storage devices, and so forth.

As described, the control module 122 may be configured to control operation of the BCS 120, or the control circuitry that drives the BCS 120. During operation, the control module 122 may access data stored within the data store 420. For example, the control module 122 may access user input data 422. The user input data 422 comprises data indicative of user input. For example, if the user 102 performs a gesture on the touch sensor 304 such as a swipe, user input data 422 may be generated that is indicative of the swipe.

The control module 122 may also access user preference data 424. The user preference data 424 may specify particular setpoint values 142, SNR values, and so forth, associated with the use of different applications, audio input type that is indicative of the type of audio output data 124, and so forth. For example, the user preference data 424 may indicate a particular minimum BCS amplitude value 136 for audio output data 124 that is designated as having an audio input type of speech or is determined to comprise speech.

The control model 122 may access threshold data 426. The threshold data 426 may comprise data indicative of thresholds used during operation. For example, the threshold data 426 may include a maximum permissible specified leakage SNR.

The control module 122 may utilize BCS limit data 428 to constrain operation. The BCS limit data 428 may specify limits of operation beyond which damage may be sustained to the BCS 120, control circuitry, the user 102, and so forth. For example, the BCS limit data 428 may specify a maximum voltage that may be applied as a drive signal to the BCS 120. The BCS limit data 428 may be configured to protect one or more of the user 102, components of the HMWD 106, and so forth. For example, the BCS limit data 428 may specify a maximum BCS amplitude value 140 that is determined to minimize the potential for hearing damage in the user 102.

The data store 420 may also store audio output data 124. For example, the audio output data 124 may be obtained from an external source, such as a music server, real time call server, telecommunication connection, and so forth.

The data store 420 may store audio input data 130. For example, the audio input data 130 may comprise data that is acquired by one or more of the AC microphone 114, the BC microphone 116, and so forth. As described above, the control module 122 may access the audio input data 130 to determine the noise level data 132. The noise level data 132 may also be stored in the data store 420.

The data store 420 may store the intelligibility data 134, the minimum BCS amplitude value 136, the leakage data 138, the maximum BCS amplitude value 140, the setpoint value 142, or other data 430.

The communication module 144 may be configured to establish communications with one or more of the computing devices 108, other HMWDs 106, servers 148, sensors, or other devices. The communications may be authenticated, encrypted, and so forth.

Other modules 432 may also be present in the memory 416. For example, the other modules 432 may include a contact management module while the other data 430 may include address information associated with a particular contact, such as an email address, telephone number, network address, uniform resource locator, and so forth.

One or more of the modules or functions associated therewith as depicted in the HMWD 106 may be present on other devices. For example, the noise level data 132 may be determined using audio input data 130 obtained by a microphone that is separate from the HMWD 106. For example, a microphone on the computing device 108 may be used to obtain the audio input data 130. In another example, the computing device 108 may use an on board microphone and process the audio input data 130, to provide the noise level data 132 to the HMWD 106.

Figure 5:
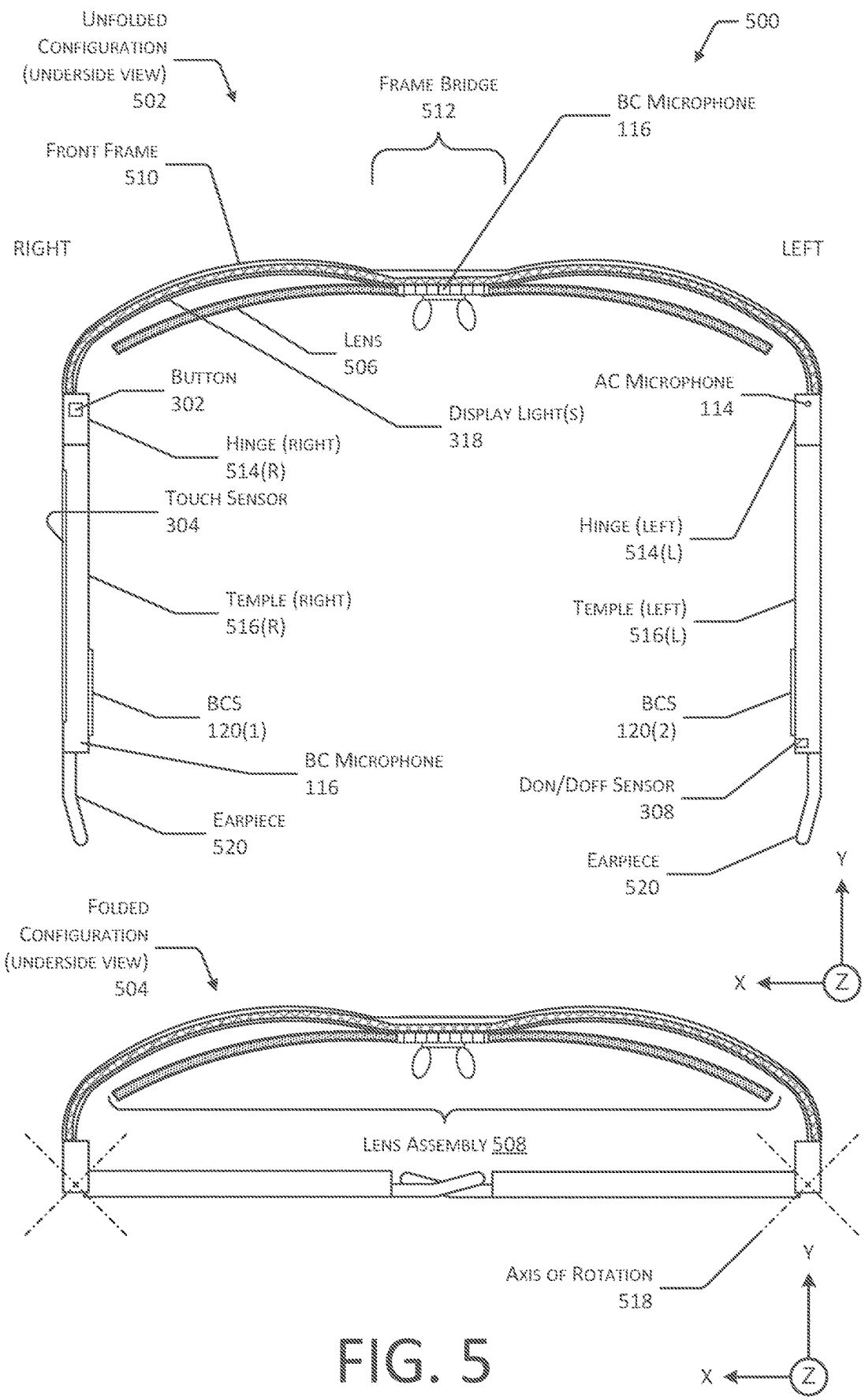
FIG. 5 depicts an exterior view, from below, of the head-mounted wearable device in unfolded and folded configurations, according to some implementations.

FIG. 5 depicts exterior views 500, from below looking up, of the HMWD 106, including a view in an unfolded configuration 502 and a view in a folded configuration 504, according to some implementations.

Visible in these views are the lenses 506 of a lens assembly 508. Because the lens assembly 508 is affixed to a front frame 510 at a frame bridge 512, the front frame 510 may flex without affecting the positioning of the lenses 506 with respect to the eyes of the user 102. For example, when the head 104 of the user 102 is relatively large, the front frame 510 may flex away from the user's 102 head 104 to accommodate the increased distance between the temples. Similarly, when the head 104 of the user 102 is relatively small, the front frame 510 may flex towards the user's 102 head 104 to accommodate the decreased distance between the temples.

One or more hinges 514 may be affixed to, or an integral part of, the front frame 510. Depicted are a left hinge 514(L) and a right hinge 514(R) on the left and right sides of the front frame 510, respectively. The left hinge 514(L) is arranged at the left brow section, distal to the frame bridge 512. The right hinge 514(R) is arranged at the right brow section, distal to the frame bridge 512.

A temple 516 may couple to a portion of the hinge 514. For example, the temple 516 may comprise one or more components, such as a knuckle, that mechanically engage one or more corresponding structures on the hinge 514.

The left temple 516(L) is attached to the left hinge 514(L) of the front frame 510. The right temple 516(R) is attached to the right hinge 514(R) of the front frame 510.

The hinge 514 permits rotation of the temple 516 with respect to the hinge 514 about an axis of rotation 518. The hinge 514 may be configured to provide a desired angle of rotation. For example, the hinge 514 may allow for a rotation of between 0 and 120 degrees. As a result of this rotation, the HMWD 106 may be placed into a folded configuration, such as shown at 504. For example, each of the hinges 514 may rotate by about 90 degrees, such as depicted in the folded configuration 504.

One or more of the front frame 510, the hinge 514, or the temple 516 may be configured to dampen the transfer of vibrations between the front frame 510 and the temples 516. For example, the hinge 514 may incorporate vibration dampening structures or materials to attenuate the propagation of vibrations between the front frame 510 and the temples 516. These vibration dampening structures may include elastomeric materials, springs, and so forth. In another example, the portion of the temple 516 that connects to the hinge 514 may comprise an elastomeric material.

One or more different sensors may be placed on the HMWD 106. For example, the BC microphone 116 may be located at the frame bridge 512 while the AC microphone 114 may be emplaced within or proximate to the left hinge 514(L), such as on the underside of the left hinge 514(L). In one implementation, the BC microphone 116 may detect vibrations transmitted from the nose of the user 102 via a nosepiece or nose pads to the frame bridge 512. The BC microphone 116 and the AC microphone 114 may be maintained at a fixed distance relative to one another during operation by the structure of the HMWD 106. For example, the relatively rigid frame of the HMWD 106 maintains the spacing between the BC microphone 116 and the AC microphone 114. While the BC microphone 116 is depicted proximate to the frame bridge 512, in other implementations, the BC microphone 116 may be positioned at other locations. For example, the BC microphone 116 may be located in one or both of the temples 516.

A touch sensor 304 may be located on one or more of the temples 516. One or more buttons 302 may be placed in other locations on the HMWD 106. For example, a button 302(1) may be emplaced within, or proximate to, the right hinge 514(R), such as on an underside of the right hinge 514(R).

One or more BCSs 120 may be emplaced on the temples 516. For example, as depicted here, a BCS 120(1) may be located on the surface of the temple 516(R) that is proximate to the head 104 of the user 102 during use. Continuing the example, as depicted here, a portion of the BCS 120(2) may be located on the surface of the temple 516(L) that is proximate to the head 104 of the user 102 during use. The BCS 120 may be configured to generate audio output 126. For example, the BCS 120 may comprise a piezoelectric speaker that provides audio to the user 102 via bone conduction through the temporal bone of the head 104.

Earpieces 520 may extend from a portion of the temple 516 that is distal to the front frame 510. The earpiece 520 may comprise a material that may be reshaped to accommodate the anatomy of the head 104 of the user 102. For example, the earpiece 520 may comprise a thermoplastic that may be warmed to a predetermined temperature and reshaped. In another example, the earpiece 520 may comprise a wire that may be bent to fit around a portion of the ear of the user 102. The wire may be encased in an elastomeric material.

A flexible printed circuit (FPC) (not shown) may provide connectivity between the electronics in the temples 516. For example, the left temple 516(L) may include electronics such as a hardware processor while the right temple 516(R) may include electronics such as a battery. The FPC provides a pathway for control signals from the hardware processor to the battery, may transfer electrical power from the battery to the hardware processor, and so forth. The FPC may provide additional functions such as providing connectivity to the AC microphone 114, the button 302(1), components within the front frame 510, and so forth. For example, a front facing camera may be mounted within the frame bridge 512 and may be connected to the FPC to provide image data to the hardware processor in the temple 516.

Figure 6:
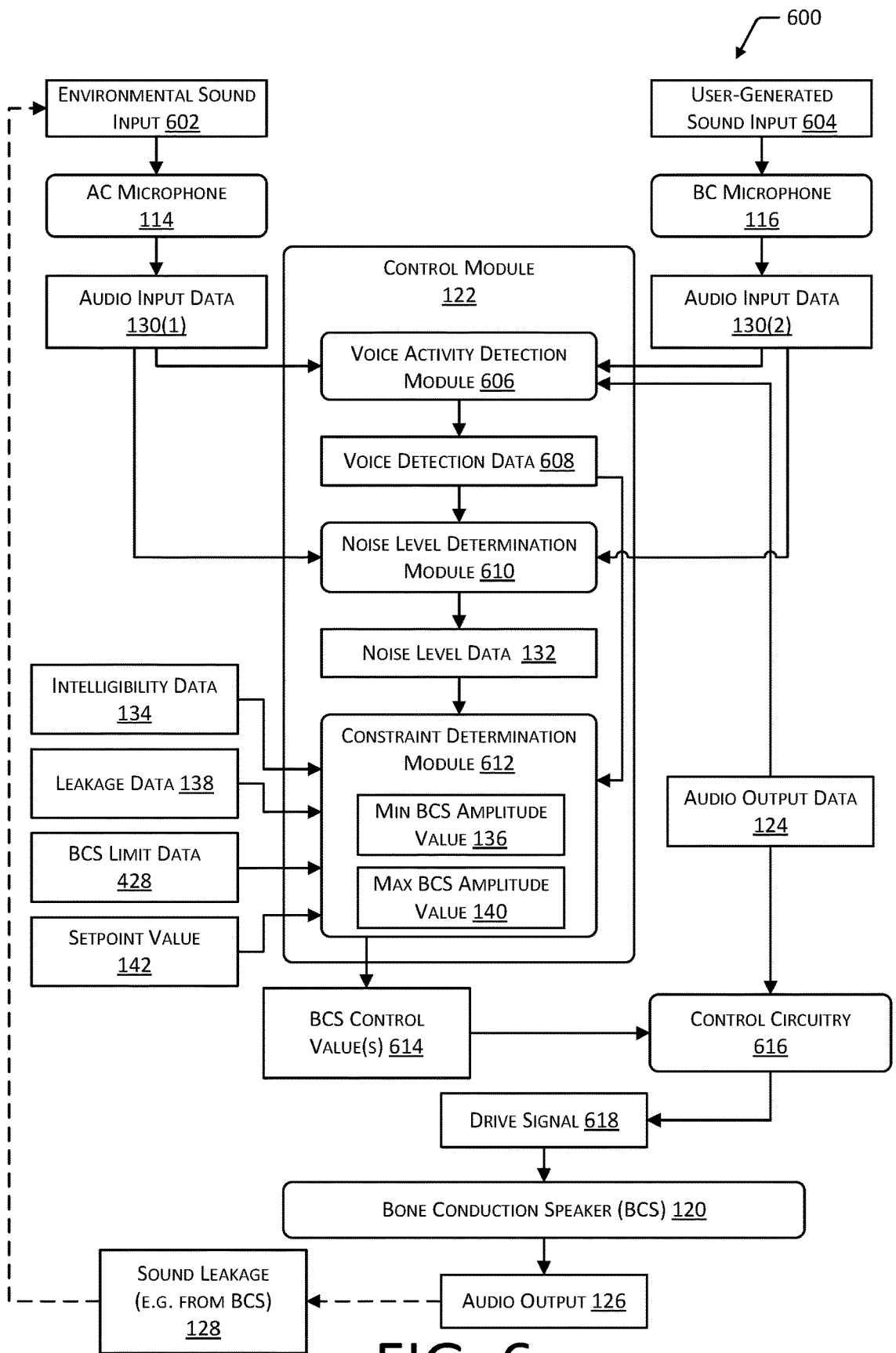
FIG. 6 depicts a block diagram of a control module that uses information about noise level to constrain the output of the BCS, according to some implementations.

FIG. 6 depicts a block diagram 600 of the control module 122 that uses information about the noise level around the HMWD 106 to constrain the output of the BCS 120, according to some implementations.

Environmental sound input 602 may be acquired by the AC microphone 114. The environmental sound input 602 may include sound leakage 128, noises made by the user 102, and so forth. The AC microphone 114 generates audio input data 130(1). For example, the AC microphone 114 located in the frame bridge 512 may be used to obtain the audio input data 130(1). By using an AC microphone 114 that is farthest from an active BCS 120, the audio input data 130(1) may be obtained while the BCS is in use.

User-generated sound input 604 may be acquired by the BC microphone 116. The user-generated sound input 604 may include sounds generated by the user 102 that are transferred to the BC microphone 116 by conduction. The BC microphone 116 generates audio input data 130(2).

The control module 122 may include a voice activity detection module 606. The voice activity detection module 606 may process one or more of the audio input data 130(1) or the audio input data 130(2) to generate voice detection data 608. The voice detection data 608 provides information indicative of whether the audio input data 130 that has been processed is deemed to include speech. For example, the voice detection data 608 may comprise a single bit value. The single bit value may be associated with the sample, or individual frames thereof, and use a zero binary value to indicate no speech is present and a one binary value to indicate speech is present.

In one implementation, the voice activity detection module 606 may determine, for a sample of the audio input data 130 that comprises a plurality of sample values representative of a signal, a zero crossing rate (ZCR). The ZCR may be calculated by dividing a count of transitions between a negative sample value and a positive sample value by a count of sample values in the sample. If the ZCR is within a threshold range, the sample may be deemed to be representative of human speech. For example, the range may extend from a minimum value of 15 to a maximum value of 100.

In other implementations, other techniques may be used. For example, if the energy level of the sample exceeds a threshold value, the sample may be deemed to be representative of human speech. Combinations of techniques may also be used to determine presence of speech, such as the ZCR and the energy level for the same sample.

A noise level determination module 610 accepts as input audio input data 130. The noise level determination module 610 processes at least a portion of the audio input data 130 to generate noise level data 132. For example, the noise level determination module 610 may calculate the noise level data 132 by determining an average energy of samples within a given period of time.

The noise level determination module 610 may use the voice detection data 608 to disregard audio input data 130 that includes speech generated by the user 102. For example, the audio input data 130(2) that is obtained from the BC microphone 116 may be processed to determine if the user 102 speaking. The noise level determination module 610 may be configured to use timestamp data associated with the voice detection data 608 to determine a time interval during which the user 102 is speaking. The noise level determination module 610 may then disregard the audio input data 130(1) obtained from the AC microphone 114 that corresponds to the speech of the user 102. Those samples which are determined to be absent of speech may thus be used to determine the noise level data 132. This prevents the noise level data 132 from being incorrectly overstated due to the proximity of the user 102 to the AC microphone 114.

In some implementations, the noise level data 132 for the surrounding environment may be determined using the audio input data 130(2) that is obtained from the BC microphone 116. Some users 102 will tend to speak more loudly when they are in a noisier environment. This may be known as the Lombard effect or Lombard reflex that was discovered by Etienne Lombard. A plurality of samples of audio input data 130(2) may be acquired using the BC microphone 116. A time interval may be determined during which at least a portion of the plurality of samples exhibit one or more characteristics indicative of speech. For example, the ZCR of the plurality of samples may be assessed to determine when the user 102 is speaking. In another example, a power density spectrum may be assessed to determine if the samples are consistent with speech. An energy value of the at least a portion of the plurality of samples in the time interval may be determined. Based on the energy value, the noise level data 132 may be inferred.

For example, a table or other data structure may store information that associates particular energy values with particular noise level values.

The control module 122 may include a constraint determination module 612. The constraint determination module 612 accepts as input the noise level data 132, the intelligibility data 134, and the leakage data 138. In some implementations, the constraint determination module 612 may also use the BCS limit data 428 and the setpoint value 142. During operation, the constraint determination module 612 determines the minimum BCS amplitude value 136 based on the noise level data 132 and the intelligibility data 134. The constraint determination module 612 also determines the maximum BCS amplitude value 140 based on the noise level data 132 and the leakage data 138. In some implementations, the constraints generated by the constraint determination module 612 may be further limited by the BCS limit data 428. For example, the maximum BCS amplitude value 140 may be limited such that the BCS 120 is not overdriven and damaged. The setpoint value 142 may be used by the constraint determination module 612 to select a particular volume of audio output 126 to produce. One or more of the minimum BCS amplitude value 136 or the maximum BCS amplitude value 140 may be specified by one or more BCS control values. For example, a BCS control value may specify a maximum power output level that produces the maximum BCS amplitude value 140.

The constraint determination module 612 may use information about the audio output data 124 that is to be presented, or is being presented. For example, the audio output data 124 may be processed by the voice activity detection module 606 to determine if the audio output data 124 includes speech or not. The voice detection data 608 for the audio output data 124 may then be used to adjust a setpoint value 142, change the lower limit 206, and so forth. For example, the constraint determination module 612 may raise the lower limit 206 to produce a higher SNR in the audio output 126 when the audio output data 124 is speech, such as on a telephone call.

In other implementations, instead of or in addition to using the voice activity detection module 606, audio output data 124 that is generated by or originates from a particular application or device may be deemed to include speech. For example, audio output data 124 that is obtained from telecommunication connection such as a telephone call may be deemed to be speech.

The constraint determination module 612 may determine a source of the audio output data 124. For example, the source may comprise a particular application, particular network address, particular network interface 412, and so forth. The BCS control values 614 may be based at least in part on the source or a type of the source. Different types of source may be associated with different constraints. The type of source is indicative of functionality provided by an application or device that provides the audio output data 124. For example, if the source of the audio output data 124 is a type of telephony application, a first set of constraints may be applied. Continuing the example, if the source of the audio output data 124 is a type of music application, a second set of constraints may be applied. In this way, one or more of the minimum BCS amplitude value 136 or the maximum BCS amplitude value 140 is determined based at least in part on the source.

The constraint determination module 612 may generate as output one or more BCS control values 614. The BCS control values 614 may be provided to control circuitry 616. The BCS control values 614 may specify an amount of amplification, attenuation, voltage, and so forth to be used by the control circuitry 616 during operation. For example, the BCS control value 614 may be indicative of amplification that is used to control an amplifier in the control circuitry 616. The control circuitry 616 during operation accepts as input the audio output data 124 and generates a drive signal 618. For example, the drive signal 618 may comprise a time varying, alternating current signal. The amplitude of the drive signal 618 is thus controlled by one or more of the BCS control values 614.

The drive signal 618 is provided to the BCS 120. The BCS 120 converts at least a portion of the energy present in the drive signal 618 into audio output 126. As described above, in some situations, there may be sound leakage 128. The sound leakage 128 may be detected by the AC microphone 114. For example, the environmental sound input 602 may include the sound leakage 128.

In some implementations, a feedback loop may be implemented in which the audio input data 130(1) that is obtained from the AC microphone 114 is processed to determine the presence of leaked sound. For example, a cross-correlation function may be applied to the audio output data 124 and the audio input data 130(1) to determine if the same signal is present in the audio output data 124. In one implementation, the cross-correlation function may comprise the xcorr function provided in MATLAB by Mathworks Inc. of Natick, Mass. In another example, the cross-correlation function may comprise the scipy.signal.correlate function as included in the Scipy library as promulgated by scipy.org. The output may comprise values indicative of cross-correlation between at least a portion of the audio output data 124 and at least a portion of the audio input data 130. If the same signal is determined to be present, energy or amplitude of the sound leakage 128 may be obtained. If a characteristic of the sound leakage 128, such as the amplitude, power, and so forth, exceeds a threshold value, the max BCS amplitude value 140 may be decreased, resulting in a BCS control value 614 changing to reduce the amplification of the control circuitry 616.

In some implementations, instead of or in addition to modifying the amplification or gain of the control circuitry 616, the audio output data 124 may be manipulated. For example, the audio output data 124 may be processed to reduce the amplitude value for the discrete samples therein.

Figure 7:
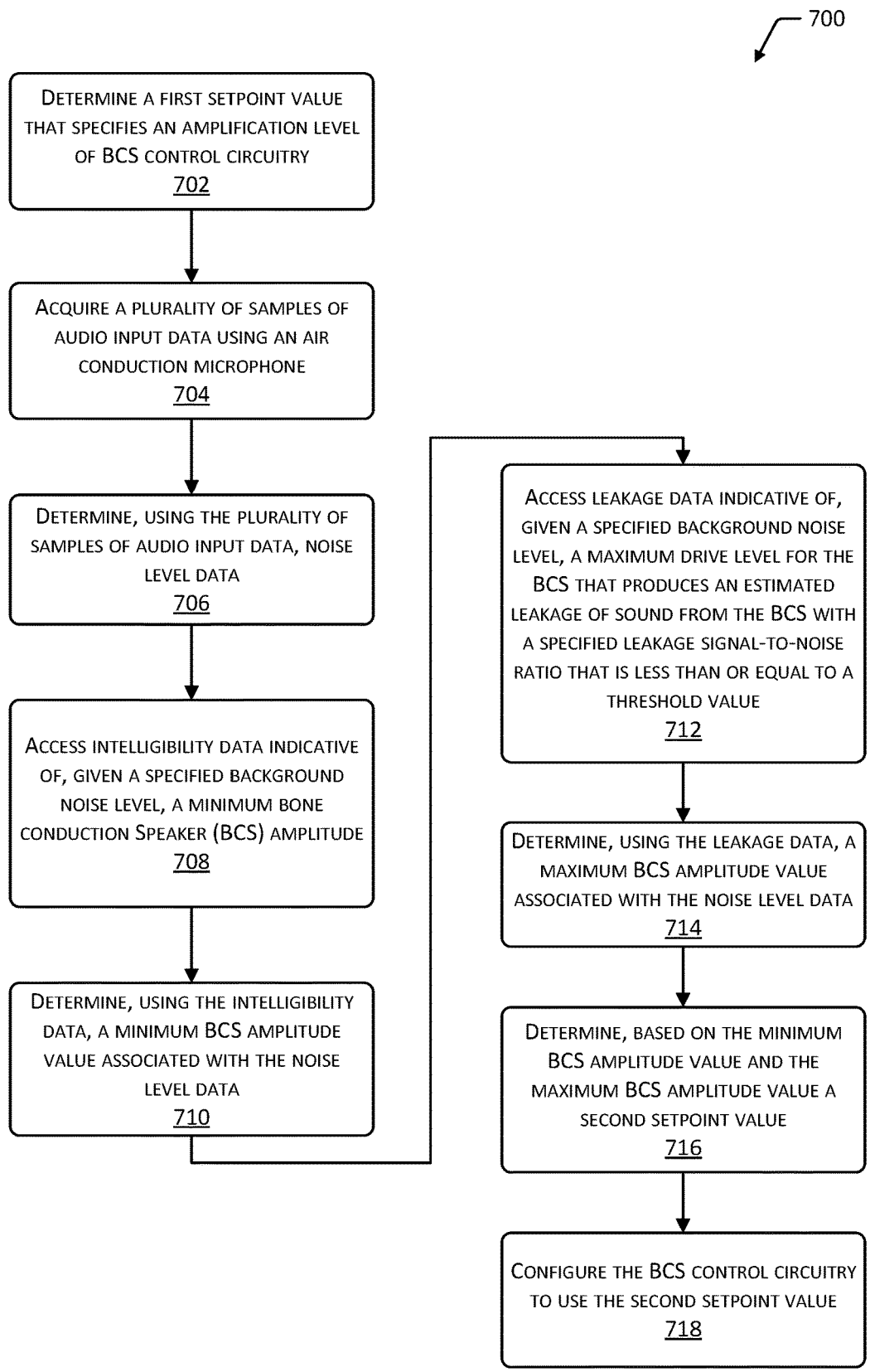
FIG. 7 depicts a flow diagram of a first process to constrain operation of a BCS, according to some implementations.

FIG. 7 depicts a flow diagram 700 of a first process to constrain operation of a BCS 120, according to some implementations. In some implementations, the process may be implemented at least in part by the HMWD 106.

At 702, a first setpoint value 142(1) is determined. The first setpoint value 142(1) specifies an amplification or gain level used by the BCS control circuitry 616 to produce a desired amplitude of the drive signal 618. For example, the first setpoint value 142(1) may be the result of a user's 102 manual input.

At 704, first audio input data 130 is acquired. For example, the AC microphone 114 may be used to acquire a plurality of samples, with each sample comprising a digitized representation of sound at a particular time.

At 706, noise level data 132 is determined using the first audio input data 130. The audio input data 130 used may include digitized samples within which human speech has been deemed to not be present. The noise level data 132 may be deemed to be indicative of a background noise level in the immediate environment of the HMWD 106.

At 708, intelligibility data 134 is accessed. As described above, the intelligibility data 134 may be indicative of, given a specified background noise level, a minimum BCS amplitude value 136 that provides a predetermined SNR of the audio output 126 with respect to the user 102.

At 710, using the intelligibility data 134, a minimum BCS amplitude value 136 associated with the noise level data 134 is determined.

At 712, leakage data 138 is accessed. As described above, the leakage data 138 may be indicative of, given a specified background noise level, a maximum amplification or drive level for the control circuitry 616 of the BCS 120. This maximum may be determined to produce an estimated sound leakage 128 from the BCS 120 that exhibits a specified leakage SNR that is that is less than or equal to a threshold value.

At 714, using the leakage data 138, a maximum BCS amplitude value 140 associated with the noise level data 132 is determined.

At 716, based on the minimum BCS amplitude value 136 and the maximum BCS amplitude value 140, a second setpoint value 142(2) is determined. The second setpoint value 142(2) specifies the amplification level used by the BCS control circuitry 616. In other implementations, other BCS control parameters may be used instead of or in addition to the amplitude level to control the output. For example, BCS control parameters may specify one or more of output level, output voltage, output power, attenuation level, pulse width, pulse modulation, pulse frequency, and so forth. For example, the setpoints may specify an output voltage.

In some situations, such as when the noise level data 132 has increased over time, the second setpoint value 142(2) may be greater than the first setpoint value 142(1). The second setpoint value 142(2) may be based at least in part on the first setpoint value 142(1). For example, if the constraints result in an increase in the BCS level 204 of 20% along the constant SNR curve 212, the second setpoint value 142(2) may be 20% greater than the first setpoint value 142(1).

At 718, the BCS control circuitry 616 is configured to use the second setpoint value 142(2).

By using this process, the control module 122 may dynamically adjust the output of the BCS 120 to minimize sound leakage 128 and maintain intelligibility of the audio output 126 to the user 102.

Figure 8:
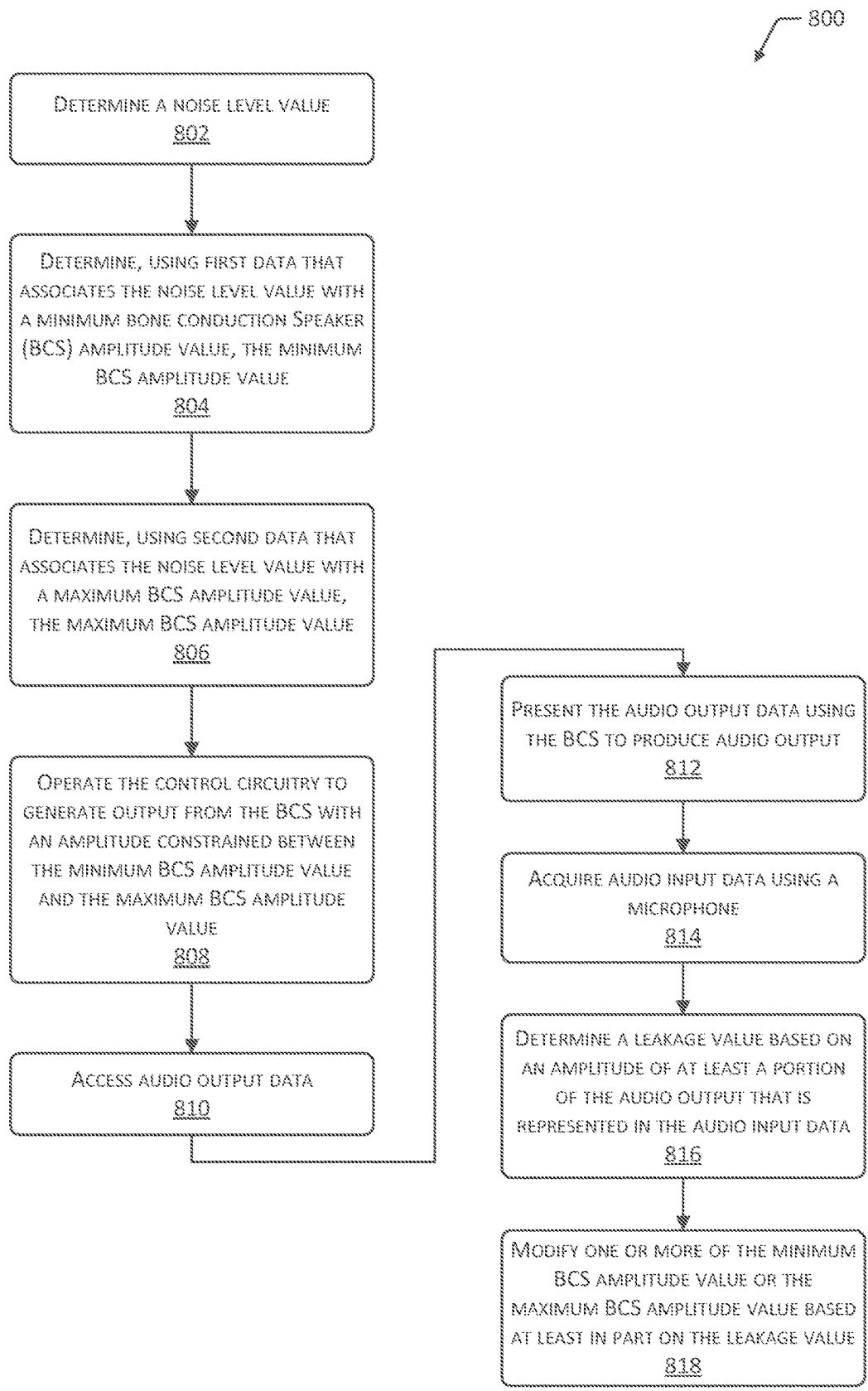
FIG. 8 depicts a flow diagram of a second process to constrain operation of a BCS, according to some implementations.

FIG. 8 depicts a flow diagram 800 of a second process to constrain operation of a BCS 120, according to some implementations. In some implementations, the process may be implemented at least in part by the HMWD 106.

At 802, a noise level data 132 is determined.

At 804, the minimum BCS amplitude value 136 is determined using first data that associates the noise level data 132 with a minimum BCS amplitude value 136. For example, the intelligibility data 134 may be accessed and used to look up a particular minimum BCS amplitude value 136 given the noise level data 132.

At 806, the maximum BCS amplitude value 140 is determined using second data that associates the noise level data 132 with a maximum BCS amplitude value 140. For example, the leakage data 138 may be accessed and used to look up a particular maximum BCS amplitude value 140 given the noise level data 132.

At 808, the BCS control circuitry 616 is operated to generate output such as a drive signal 618 with an amplitude constrained between the minimum BCS amplitude value 136 and the maximum BCS amplitude value 140.

At 810, audio output data 124 is accessed.

At 812, the audio output data 124 is presented using the BCS 120 to produce audio output 126. For example, upon a determination that the HMWD 106 has been donned by the user 102, a "welcome" sound may be presented. Continuing the example, sensor data from the don/doff sensor 308 may be used to determine that the HMWD 106 has been donned.

At 814, audio input data 130(1) is acquired using an AC microphone 114.

At 816, a leakage value is determined based on one or more characteristics of at least a portion of the audio output 126 that is represented in the audio input data 130(1). The one or more characteristics may include but are not limited to, amplitude, power, and so forth. For example, a cross-correlation function may be used to determine if the cross-correlation value of the audio output data 124 and the audio input data 130(1) exceeds a threshold value, indicating a common signal in both.

At 818, one or more of the minimum BCS amplitude value 136 or the maximum BCS amplitude value 140 may be modified based at least in part on the leakage value. For example, it may be determined that the leakage value exceeds a threshold value. As a result, the maximum BCS amplitude value 140 may be reduced.

The modification of one or more of the minimum BCS amplitude value 136 or the maximum BCS amplitude value 140 may include several steps. For example, the maximum BCS amplitude value 140 may be determined based on the leakage value. The constraint of the output of the BCS 120 between the prior minimum BCS amplitude value 136 and the prior maximum BCS amplitude value 140 may be discontinued. Subsequently, the output of the BCS 120 may be constrained between the minimum BCS amplitude value 136 and the modified maximum BCS amplitude value 140.

At described above, the constraints may change with time. The process may repeat or loop at a predefined interval, operate upon the occurrence of a particular event, and so forth. For example, the process may operate and the constraints update after audio output data 124 has been queued for presentation by the BCS 120.

The transitions between different constrained values may be ramped over a period of time. For example, the transition depicted above with regard to FIG. 2 between setpoint value 142(1) and setpoint value 142(2) may be performed over a span of several seconds. The time interval used to transition from one setpoint value 142 to another may vary depending on how the constraints change. For example, an increase in the BCS level 204 may take place over a time interval of five seconds, while a decrease in the BCS level 204 may take place over a time interval of 1 second.

The processes discussed herein may be implemented in hardware, software, or a combination thereof. In the context of software, the described operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. Those having ordinary skill in the art will readily recognize that certain steps or operations illustrated in the figures above may be eliminated, combined, or performed in an alternate order. Any steps or operations may be performed serially or in parallel. Furthermore, the order in which the operations are described is not intended to be construed as a limitation.

Embodiments may be provided as a software program or computer program product including a non-transitory computer-readable storage medium having stored thereon instructions (in compressed or uncompressed form) that may be used to program a computer (or other electronic device) to perform processes or methods described herein. The computer-readable storage medium may be one or more of an electronic storage medium, a magnetic storage medium, an optical storage medium, a quantum storage medium, and so forth. For example, the computer-readable storage media may include, but is not limited to, hard drives, floppy diskettes, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further, embodiments may also be provided as a computer program product including a transitory machine-readable signal (in compressed or uncompressed form). Examples of transitory machine-readable signals, whether modulated using a carrier or unmodulated, include but are not limited to signals that a computer system or machine hosting or running a computer program can be configured to access, including signals transferred by one or more networks. For example, the transitory machine-readable signal may comprise transmission of software by the Internet.

Separate instances of these programs can be executed on or distributed across any number of separate computer systems. Thus, although certain steps have been described as being performed by certain devices, software programs, processes, or entities, this need not be the case, and a variety of alternative implementations will be understood by those having ordinary skill in the art.

Specific physical embodiments as described in this disclosure are provided by way of illustration and not necessarily as a limitation. Those having ordinary skill in the art readily recognize that alternative implementations, variations, and so forth, may also be utilized in a variety of devices, environments, and situations. Although the subject matter has been described in language specific to structural features or methodological acts, it is to be understood that the subject matter defined in the appended claims is not necessarily limited to the specific features or acts described. Rather, the specific features, structures, and acts are disclosed as exemplary forms of implementing the claims.

What is claimed is:

1. A head-mounted wearable device (HMWD) comprising:
   a bone conduction speaker (BCS) configured to generate sound;
   BCS control circuitry connected to the BCS that is configurable to provide a drive signal to the BCS that will present audio output based on the drive signal;
   an air conduction microphone;
   a first memory, storing first computer-executable instructions; and
   a first hardware processor to execute the first computer-executable instructions to:
      determine a first setpoint value, wherein the first setpoint value specifies a first amplification level used by the BCS control circuitry to produce a desired amplitude of the drive signal;
      acquire audio input data using the air conduction microphone;
      determine, using the audio input data, noise level data indicative of a background noise level;
      access intelligibility data indicative of, given a specified background noise level, a corresponding minimum BCS amplitude value;
      determine, using the intelligibility data, a minimum BCS amplitude value associated with the noise level data;
      access leakage data indicative of, given the specified background noise level, a corresponding maximum amplification for the BCS that produces an estimated leakage of sound from the BCS with a specified leakage signal-to-noise ratio that is less than or equal to a threshold value;
      determine, using the leakage data, a maximum BCS amplitude value associated with the noise level data;
      determine, based on the minimum BCS amplitude value and the maximum BCS amplitude value, a second setpoint value that specifies a second amplification level used by the BCS control circuitry, wherein the second setpoint value is based at least in part on the first setpoint value; and
      configure the BCS control circuitry using the second setpoint value.

2. The HMWD of claim 1, wherein the threshold value of the specified leakage signal-to-noise ratio (SNR) is below 0 dBA.

3. The HMWD of claim 1, further comprising:
   a touch sensor;
   the first memory, storing second computer-executable instructions; and
   the first hardware processor to execute the second computer-executable instructions to:
      acquire touch sensor input indicative of one or more touches to the touch sensor; and
      generate the first setpoint value based on the touch sensor input.

4. A system comprising:
   a bone conduction speaker (BCS);
   control circuitry connected to the BCS and configurable to operate the BCS;
   a first memory storing first computer-executable instructions; and
   a first hardware processor to execute the first computer-executable instructions to:
      determine a noise level value;
      access intelligibility data;
      determine, using the intelligibility data that associates the noise level value with a first BCS control value, the first BCS control value;
      determine, using second data that associates the noise level value with a second BCS control value, the second BCS control value; and
      operate the control circuitry to generate audio output from the BCS that is constrained by the first BCS control value and the second BCS control value.

5. The system of claim 4, wherein the first BCS control value corresponds to a minimum output amplitude of the BCS during operation and the second BCS control value corresponds to a maximum output amplitude of the BCS during operation.

6. The system of claim 4, further comprising:
   an air conduction microphone;
   the first memory storing second computer-executable instructions; and
   the first hardware processor to execute the second computer-executable instructions to:
      access audio output data, wherein the control circuitry generates the audio output using the audio output data;
      acquire audio input data using the air conduction microphone;

determine data indicative of a characteristic of at least a portion of the audio output data that is represented in the audio input data;
generate a leakage value based on the data indicative of the characteristic;
determine the leakage value exceeds a threshold value;
determine a third BCS control value; and
operate the control circuitry to generate second audio output from the BCS that is constrained by the first BCS control value and the third BCS control value.

7. The system of claim 6, the second computer-executable instructions to generate the leakage value comprising computer-executable instructions to:
determine a cross-correlation between the at least a portion of the audio output data and at least a portion of the audio input data.

8. The system of claim 4, further comprising:
an air conduction microphone;
a sensor;
the first memory storing second computer-executable instructions;
the first hardware processor to execute the second computer-executable instructions to:
acquire sensor data using the sensor;
determine, based on the sensor data, that the BCS is likely to be in contact with a wearer; and
access previously stored audio output data;
the first computer-executable instructions use the previously stored audio output data to operate the control circuitry to generate the audio output; and
the second computer-executable instructions further comprising instructions to:
acquire audio input data using the air conduction microphone;
determine data indicative of a characteristic of at least a portion of the previously stored audio output data that is represented in the audio input data;
generate a leakage value based on the data indicative of the characteristic;
determine the leakage value exceeds a threshold value;
determine a third BCS control value; and
operate the control circuitry to generate second audio output from the BCS that is constrained by the first BCS control value and the third BCS control value.

9. The system of claim 8, wherein the previously stored audio output data comprises previously stored digitized data representative of sound.

10. The system of claim 4, further comprising;
the first memory storing second computer-executable instructions; and
the first hardware processor to execute the second computer-executable instructions to:
access audio output data designated for presentation using the BCS;
determine a type of source of the audio output data;
wherein the first BCS control value is determined based at least in part on the type of source; and
wherein the second BCS control value is determined based at least in part on the type of source.

11. The system of claim 10, wherein the type of source is indicative of functionality provided by an application that provides the audio output data.

12. The system of claim 4, further comprising:
a bone conduction (BC) microphone;
the first memory storing second computer-executable instructions; and
the first hardware processor to execute the second computer-executable instructions to:
acquire first audio input data using the BC microphone;
determine a time interval during which at least a portion of the first audio input data is unlikely to include speech; and
wherein the first computer-executable instructions to determine the noise level value use the at least a portion of the first audio input data.

13. The system of claim 12, the second computer-executable instructions to determine the time interval further comprising computer-executable instructions to:
determine, for the at least a portion of the first audio input data a zero crossing rate (ZCR) by dividing a count of transitions between a negative sample value to a positive sample value by a count of sample values in the time interval; and
determine the ZCR is within a ZCR threshold value range.

14. The system of claim 4, further comprising:
a bone conduction (BC) microphone;
the first memory storing second computer-executable instructions; and
the first hardware processor to execute the second computer-executable instructions to:
acquire first audio input data using the BC microphone;
determine a time interval during which at least a portion of the first audio input data exhibits one or more characteristics indicative of speech;
determine an energy value of the first audio input data in the time interval; and
wherein the determination of the noise level value is based on the energy value.

15. The system of claim 4, further comprising:
the first memory storing second computer-executable instructions; and
the first hardware processor to execute the second computer-executable instructions to:
determine a second noise level value;
determine, using third data that associates the second noise level value with a third BCS control value, the third BCS control value;
determine, using fourth data that associates the second noise level value with a fourth BCS control value, the fourth BCS control value; and
operate the control circuitry to transition, over a predetermined time interval, to generate second audio output constrained by the third BCS control value and the fourth BCS control value.

16. The system of claim 4, further comprising:
an air conduction microphone; and
the first computer-executable instructions to determine the noise level value comprising instructions to:
acquire first audio input data using the air conduction microphone;
determine an energy level of at least a portion of the first audio input data; and
determine the noise level value associated with the energy level.

17. The system of claim 4, wherein
the intelligibility data comprises information that associates particular noise level values with particular minimum BCS amplitude values,
each of the particular minimum BCS amplitude values provides a signal-to-noise ratio (SNR) to a user such that the audio output is intelligible under a corresponding particular noise level value, and
the intelligibility data is stored in a data structure.

18. The system of claim 17, wherein the computer-executable instructions to determine the first BCS control value further comprises computer-executable instructions to:
  using the noise level value, look up a minimum BCS amplitude value that corresponds with the noise level value; and
  designate the minimum BCS amplitude value in the intelligibility data as the first BCS control value.

19. A method comprising:
  determining a noise level value;
  determining, based on the noise level value, a first bone conduction speaker (BCS) control value;
  accessing leakage data;
  determining a second BCS control value based on the leakage data; and
  operating control circuitry of a BCS to generate output from the BCS that is constrained by the first BCS control value and the second BCS control value.

20. The method of claim 19, the determining the first BCS control value comprising:
  accessing a data structure storing a particular noise level value that is associated with a particular BCS control value.

21. The method of claim 19, further comprising:
  presenting audio output data using the BCS to produce audio output;
  acquiring audio input data using an air conduction microphone; and
  determining a leakage value based on one or more characteristics of at least a portion of the audio output that is represented in the audio input data.

22. The method of claim 21, further comprising:
  determining a third BCS control value based on the leakage value;
  discontinuing the constraining the output of the BCS using the first BCS control value; and
  operating the control circuitry of the BCS to generate output from the BCS that is constrained by the first BCS control value and the third BCS control value.

23. The method of claim 19, further comprising:
  determining an audio input type of audio input data, wherein the audio input type is indicative of one or more of speech or non-speech and the audio input data is designated for output using the BCS; and
  wherein the determining the first BCS control value is based at least in part on the audio input type.

24. The method of claim 19, further comprising:
  acquiring audio input data using a BC microphone;
  determining a time interval during which at least a portion of the audio input data exhibits one or more characteristics indicative of speech;
  determining an energy value of the audio input data in the time interval; and
  wherein the determining the noise level value is based on the energy value.

* * * * *